United States Patent
Pogue et al.

(10) Patent No.: US 10,937,561 B2
(45) Date of Patent: Mar. 2, 2021

(54) METHODS AND COMPOSITIONS FOR FABRICATION OF SUPERCONDUCTING WIRE

(71) Applicant: The Texas A&M University System, College Station, TX (US)

(72) Inventors: Nathaniel Pogue, Livermore, CA (US); Joshua N. Kellams, College Station, TX (US); Peter McIntyre, Bryan, TX (US)

(73) Assignee: The Texas A&M University System, College Station, TX (US)

(*) Notice: Subject to any disclaimer, the term of this patent is extended or adjusted under 35 U.S.C. 154(b) by 389 days.

(21) Appl. No.: 15/531,439

(22) PCT Filed: Dec. 18, 2015

(86) PCT No.: PCT/US2015/066726
§ 371 (c)(1),
(2) Date: May 28, 2017

(87) PCT Pub. No.: WO2016/100844
PCT Pub. Date: Jun. 23, 2016

(65) Prior Publication Data
US 2017/0287583 A1     Oct. 5, 2017

Related U.S. Application Data

(60) Provisional application No. 62/094,951, filed on Dec. 19, 2014.

(51) Int. Cl.
*H01B 1/02* (2006.01)
*H01L 39/14* (2006.01)
(Continued)

(52) U.S. Cl.
CPC ............... *H01B 1/026* (2013.01); *B22F 3/02* (2013.01); *B22F 3/20* (2013.01); *B22F 3/24* (2013.01); *B22F 5/12* (2013.01); *C22C 9/01* (2013.01); *H01B 12/04* (2013.01); *H01L 39/126* (2013.01); *H01L 39/143* (2013.01); *H01L 39/2419* (2013.01); *B22F 2003/242* (2013.01); *B22F 2301/255* (2013.01); *B22F 2302/25* (2013.01); *B22F 2304/054* (2013.01)

(58) Field of Classification Search
CPC .................................. H01B 1/026; B22F 3/02
See application file for complete search history.

(56) References Cited

U.S. PATENT DOCUMENTS 3,060,517 A    10/1962  Fields
4,575,927 A     3/1986  Braginski et al.
(Continued)

*Primary Examiner* — Paul A Wartalowicz
(74) *Attorney, Agent, or Firm* — Winstead PC

(57) ABSTRACT

The present disclosure relates generally to wires and more particularly to textured powder wires containing nanoscale metallic silver powder. The invention presents an improvement of the process of making compressed cores of textured-powder high-temperature superconductor previously using the micaceous high-temperature superconductor Bi-2212. Embodiments of the claimed methods are useful with the micaceous high-temperature superconductors, notably Bi2Sr2CaCu2O8+x (Bi-2212) and Bi2Sr2Ca2Cu3O10+x (Bi-2223) and rare earth barium copper oxide (REBCO).

13 Claims, 7 Drawing Sheets

(51) Int. Cl.
*H01L 39/24* (2006.01)
*H01L 39/12* (2006.01)
*B22F 3/02* (2006.01)
*B22F 3/20* (2006.01)
*B22F 3/24* (2006.01)
*B22F 5/12* (2006.01)
*C22C 9/01* (2006.01)
*H01B 12/04* (2006.01)

(56) References Cited

U.S. PATENT DOCUMENTS

| | | |
|---|---|---|
| 4,980,964 A | 1/1991 | Boeke |
| 5,149,681 A | 9/1992 | Ohkawa et al. |
| 6,010,983 A | 1/2000 | Topchiashvili et al. |
| 6,046,075 A | 4/2000 | Manteghi |
| 2003/0032560 A1 | 2/2003 | Otto et al. |
| 2010/0248969 A1 | 9/2010 | Fujikami et al. |
| 2010/0254212 A1* | 10/2010 | Howe ............ B01F 11/0031 366/128 |
| 2012/0028809 A1 | 2/2012 | McIntyre et al. |
| 2013/0273243 A1 | 10/2013 | Moorlag et al. |

\* cited by examiner

METHODS AND COMPOSITIONS FOR FABRICATION OF SUPERCONDUCTING WIRE

CROSS REFERENCES TO RELATED APPLICATIONS

This application claims the benefit under 35 U.S.C. § 119(e) of U.S. Provisional Patent Application No. 62/094,951, filed Dec. 19, 2014, which is incorporated herein by reference in its entirety as if fully set forth herein.

FIELD OF THE INVENTION

The present disclosure relates generally to wires and more particularly to textured-powder wires containing nanoscale metallic silver powder. The presence of silver conveys a beneficial enhancement of grain growth and interconnecting growth of grains during non-melt heat treatment. The disclosure includes a process of making compressed cores of textured-powder high-temperature superconductor previously using the micaceous high-temperature superconductor Bi-2212. Embodiments of the claimed methods are useful with the micaceous high-temperature superconductors, notably $Bi_2Sr_2CaCu_2O_8+x$ (Bi-2212) and $Bi_2Sr_2Ca_2Cu_3O_{10}+x$ (Bi-2223) and rare earth barium copper oxide (REBCO).

BACKGROUND OF THE INVENTION

The only round-wire conductor utilizing a high-field superconductor today is Ag/Bi-2212 wire which is comprised of multiple cores of Bi-2212 fine powder that are contained within a silver matrix. Fabrication of the wire begins by preparing a fine powder (~1 micron average grain size) of Bi-2212 using conventional processes. The powder is placed into hollow tubes of silver or silver-alloy, compacted, and extruded and drawn into fine wire. The wire is then restacked and drawn to make a multi-filament round wire. This process is called oxide-powder-in-tube (OPIT) and it is used to make all current-generation Ag/Bi-2212 wire.

OPIT-process Ag/Bi-2212 wire will not carry superconducting current in its as-made state. Although each powder grain is superconducting when cooled below its transition temperature, there is no superconducting transport across grain boundaries and therefore superconducting current cannot flow within a long wire. In order for Ag/Bi-2212 wire to support a superconducting current, a full-melt heat treatment is typically used in which the wire is heated to the melt temperature of Bi-2212 (~887° C.) so that all grains melt within the powder cores. The temperature is then lowered just below melt temperature to re-crystallize into the Bi-2212 solid phase. After re-crystallization, the temperature is then reduced very slowly to anneal the crystals so that they interconnect through solid-phase diffusion. The full-melt processing must be done once the wire is in final form in cable and windings, since the re-formed polycrystalline Bi-2212 is fragile and the superconducting bridges among crystals break under bending or compression.

The presence of Ag in contact with a powder of Bi-2212 produces a local reduction in the melt temperature at the interface between Ag and the Bi-2212 grain, or alternatively a contact-interaction enhancement of solid-phase diffusion within the grain. The reduction in local melt temperature at the Ag-Bi-2212 interface is accompanied by an enhancement of the re-crystallization of Bi-2212 from melt, with the consequence that a disproportionate share of superconducting current is transported close to that interface.

The full-melt processing used in present-day Ag/Bi-2212 wire technology has four significant problems. First, the melt has a lower solubility for oxygen than the oxygen content in the stoichiometry of Bi-2212, so the matrix containing the cores must be made from silver (which is permeable to oxygen diffusion at the 880° C. melt temperature), and the heat treatment must be conducted in a pure oxygen environment. Silver is expensive as a matrix material (the silver matrix costs as much as half of the entire cost of an Ag/Bi-2212 wire), is mechanically weak for wiredrawing, and shows poor strength for use in high-field windings and cabling. Second, the molten liquid formed by melting Bi-2212 is chemically aggressive and dissolves silver from channels within the wire and forms intergrowths among cores in wire. Cation species within the melt thus become mobile to diffuse through the silver and can react with atoms in materials on the outer surface of the wire or on neighboring insulating or structural materials so that the stoichiometry in the liquid shifts from that which is optimum for re-crystallization of Bi-2212. Third, there are multiple other phases that can form from the melt liquid, including the low-temperature superconductor Bi-2201, alkaline-earth cuprates, and copper-free phases. These competing phases can form in some cases more quickly than the desired Bi-2212 phase such that 'rocks' grow within core channels and obstruct superconducting transport. Fourth, the powder-filled cores contain significant void space (porosity) between grains. Thus, when the powder is melted, the voids coalesce to form larger bubbles that can partially or completely occlude a core channel and interrupt re-crystallization so that superconducting transport is disrupted. These problems, arising from full-melt heat treatment, are the primary themes that have limited the performance of Ag/Bi-2212 wire and cable to the present day.

U.S. Pat. No. 8,592,346 teaches that it is possible to attain a high-density textured core of Bi-2212 powder by in which the a-b planes of the crystal structure are oriented in parallel to each other, a property called texturing. U.S. Pat. No. 8,592,346 teaches that a uniaxial compression of 2,000 psig produces a texture of ~80% within the compacted powder. Since superconducting current occurs preferentially in the a-b planes, the textured orientation is preferable to the random orientation that is present in OPIT processing.

U.S. Pat. No. 8,592,346 also suggests the possibility of eliminating the full-melt heat treatment. It has been shown that when a textured-powder core is heated to just below melt temperature (hereafter referred to as "solid-phase heat treatment"), grains re-shape themselves through solid-phase diffusion, in which each grain grows larger in the a-b plane and shrinks in the c-direction. Because the powder is not melted, the problems associated with full-melt processing do not occur. Additionally, there is evidence that the a-b plane growth is substantial, i.e., a factor of 10 in the face area of a grain, if the cores are maintained at ~865-870° C. for 24 hours. However, the individual grains retained their separate identity, and there was little evidence in studies of the microstructure that adjacent grains grew into one another to form yet-larger grains that could support current transport in the superconducting phase. Current transport is therefore still inhibited at the grain boundaries, so the improved grain structure was not capable of supporting super-conducting current transport.

Based on the above observations, it would be desirable to form silver-containing Bibased wires that are capable of supporting superconducting current transport and do not display current transport inhibition at the grain boundaries.

SUMMARY OF THE INVENTION

An aspect of the invention is directed to the addition of silver nanoparticles to a fine powder of Bi-2212. The Ag nanopowder addition conveys beneficial enhancement of grain growth and interconnection of neighboring grains during non-melt heat treatment.

A further aspect of the invention is directed to a method by which the admixture of silver nanoparticles can be dispersed homogeneously among the grains of Bi-2212 powder. Homogenization is a challenge for powders of nanoscale because of the prevalence of static electric forces. A method is reported and demonstrated to achieve homogeneous mixing of the powder constituents.

A further aspect of the invention is directed to a new method of surface-melt heat treatment, made possible through the mediation of the dispersion of silver nanoparticles, in which surface melting and solid-phase diffusion are greatly enhanced by the presence of silver nanoparticles without melting the bulk of the Bi-2212 grains. Each grain forms a thin layer of liquid on their surfaces but does not melt. Results of rapid grain growth indicate that this surface-liquid layer dramatically increases the rate at which the a-b area of grains increases.

A further aspect of the invention is directed to improving the current transport after heat treatment of a composition comprising Bi-2212 fine powder interspersed with nanoscale silver powder, wherein the neighboring grains are induced to grow into one another so that connectivity may be established for transport of superconducting current among contacting grains. In accordance with certain embodiments of the invention, grain growth and connectivity can proceed very quickly, such that the grain growth that previously occurred in a 24 hour solid-phase heat treatment may occur in as little as 20 minutes.

A further aspect of the invention is directed to a method of fabricating a monocore of powder mixture including the steps of: producing a textured powder core by compressing a mixture of a micron-scale Bi-2212 powder with nanometer-scale silver powder by applying uniaxial compression of a male forming die upon a volume of powder mixture contained in a female forming die, in which the male forming die has side boundaries that are a close-sliding fit within the side boundaries of the female forming die, to form a compacted textured rod of approximately square cross-section, hereafter called a core.

A further aspect of the invention is directed to a composition comprising a metal cylindrical tube containing a core or a multiplicity of cores, wherein the ends of the metal tube are sealed by metallic plugs and the tube is extruded or drawn to form a bonded composite wire, hereafter called a monocore wire.

A further aspect of the invention is directed to a composite wire in which a multiplicity of monocore wires are stacked in a hex-close-packed bundle, the bundle is inserted into a metallic sheath tube, metallic plugs are inserted into the ends of the sheath tube, and the sheath tube is extruded and/or drawn to form a fully bonded composite wire of desired dimension, hereafter called a hex-stack composite wire.

A further aspect of the invention includes overpressure processing at 5~10 MPa in pure oxygen during heat treatment.

A further aspect of the invention is directed to a composite wire in which a multiplicity of cores are arrayed in parallel square-cross-section channels in a silver-alloy sheet, a cover sheet of pure silver is applied and compressed to seal the channels, the sheet is wrapped around a cylindrical metallic core rod to form a 'jelly-roll' configuration, the jelly-roll configuration may be inserted into a metallic sheath tube, plugs are inserted in the ends of the sheath tube, and the sheath tube is extruded and/or drawn to form a fully bonded composite wire of desired dimension, hereafter called a jelly-roll composite wire.

A further aspect of the invention is directed to a jelly-roll composite wire in which the central metallic core rod is made of a metal alloy that is passive to high-temperature diffusion of metal ions and also passive to oxidation, for example aluminum bronze containing ~11% aluminum, in which during the surface-melt heat treatment it has been shown that the aluminum content diffuses to the surface of the bronze rod and oxidizes to form a diffusion barrier, so that in the final jelly-roll composite wire the central metallic core rod provides mechanical reinforcement of the strength to maintain integrity of the jelly-roll composite during extrusion and/or drawing and also improvement of mechanical properties of the final wire after heat treatment.

In some aspects of the invention, a surface-melt heat treatment that is enabled by the addition of Ag nanoparticles results in formation of dense Bi-2212 cores in which grains are significantly interconnected. The surface melting on the grain surfaces does not provide a route for cation migration, and thus the core stoichiometry is less susceptible to degradation from surface-melt heat treatment. Removing a possible route for cation diffusion conveys important benefits relative to cost for incorporating Bi-2212 wire into cables and windings.

DESCRIPTION OF EXEMPLARY EMBODIMENTS

Figure 1:
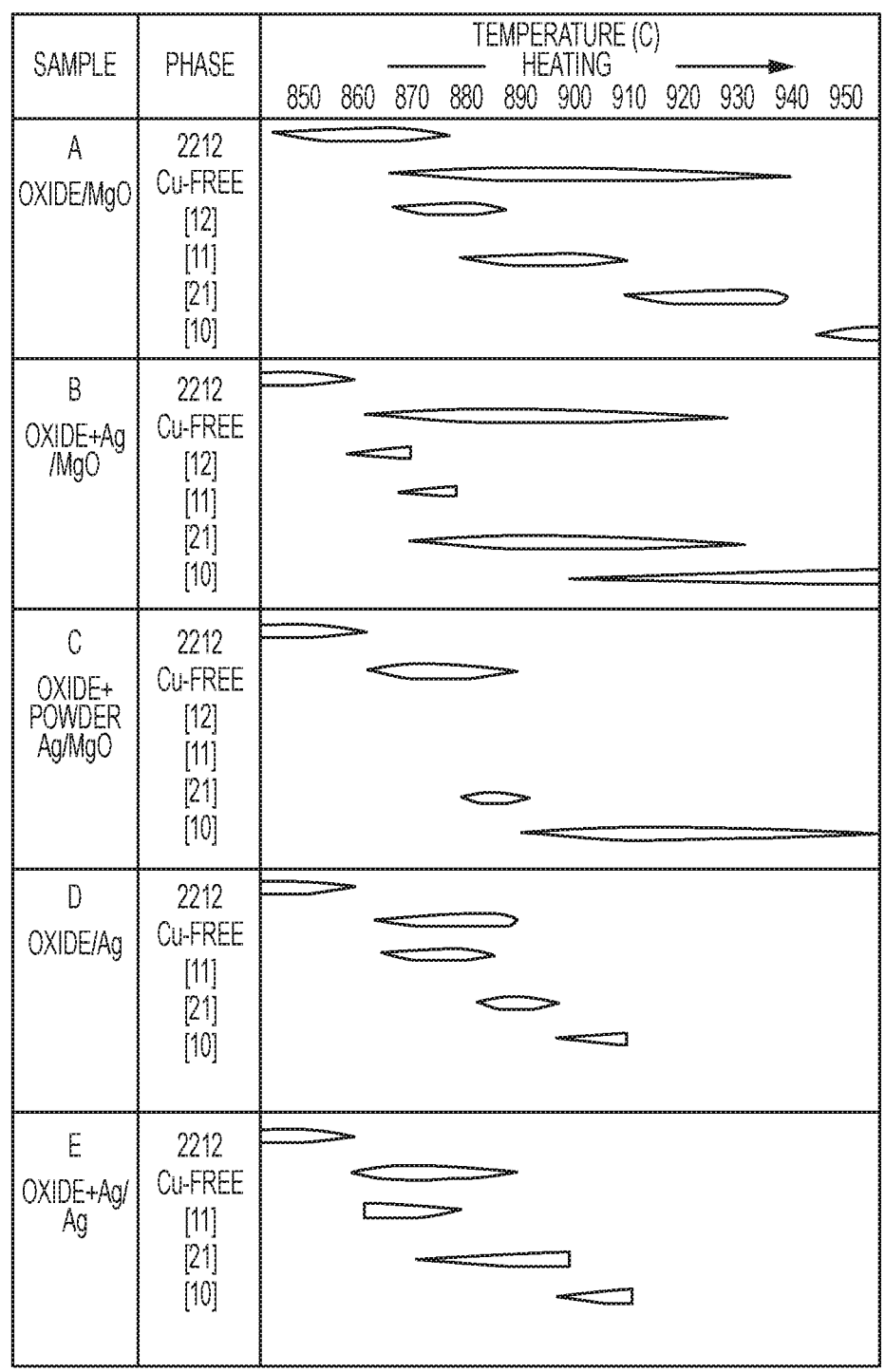
FIG. 1 is a graph that showing results from an analysis of phase changes of oxide layers for various samples of nano-Ag Bi-2212.

In one embodiment, a method of processing Bi-2212 to form a wire includes applying a surface-melt heat treatment in various atmospheres. The atmospheres may include an oxygen atmosphere, an atmosphere including air, or an inert atmosphere. The surface-melt heat treatment is carried out such that grains of the Bi-2212 do not melt. As a result, it is not necessary to provide pathways for oxygen to pass into and out of the wire during the surface-melt heat treatment. If superconducting performance can be achieved without oxygen-permeable matrix on the wire, a requirement to conduct the surface-melt heat treatment in an oxygen atmosphere can be eliminated Eliminating oxygen atmosphere from the heat treatment also simplifies operational design requirements for the heat treatment furnace and eliminates oxidation damage to structural material supporting a winding.

In another embodiment of the invention heat treatment includes a slow anneal following a period of surface-melt heat treatment, in which the temperature is reduced to 845° C. and held at that temperature for an extended period of time, for example 48 hours. Evaluation of the microstructure following such an anneal step indicates that significant intergrowth among grains occurs during the anneal step, which promotes effective current transfer in the completed wire.

In an alternative embodiment, the wire is heated to a temperature just above the melting point of Bi-2212 for a short period and then cooled just below the melting point to recrystallize grains of the Bi-2212. Upon recrystallization, the temperature is then further reduced for an annealing period at 845° C. In this alternative heat treatment, the original grain structure is lost, but the benefits of the higher powder density and favorable drawing properties of the cores that result from the original texturing are preserved.

An embodiment of the invention is directed to substituting a silver sheath composition of core tubes with silver plated nickel (i.e. Bi-2212/X, in which X may be Ni or any benign metal), as a benefit of using surface-melt processing. Nickel is not permeable to oxygen at process temperature. Because only the surface layer of grains melts, an incremental volume of oxygen in excess of solubility in the liquid layer is greatly reduced and diffusivity of oxygen in the matrix may not be necessary. Using an alternative matrix metal other than silver reduces material costs and improves strength of the finished wire.

In certain embodiments, the exterior of the nickel sheath of a Bi-2212/X wire is coated with copper, either by electroplating or any other conventional method. The copper coating provides a convenient method of formation of low-resistance splice joints between segments of wire, and soft lateral contact between neighboring wires to provide current-sharing within a cable. Because it may be possible to eliminate the oxygen atmosphere during heat treatment, the copper coating can be preserved in a high-conductivity state.

Preparation of Ag-Bi2212 powder

A nano-Ag Bi-2212 powder may be prepared using Bi-2212 fine-powder and nanoscale Ag powder. The Bi-2212 powder contains nearly phase-pure Bi-2212 with an average particle size of approximately 1-2 microns. The sample used in the experiments herein was produced by a Nexans melt-cast process. The Ag nanopowder is 99.99% pure Ag. The Ag nanopowder may have particle size of approximately 80-100 nm, or alternatively approximately 10 nm. The powders are mixed with 4.75% weight fraction of silver, the balance being Bi-2212. Larger or smaller silver fractions and powders with alternative purities and particle sizes may also be used in compounding the nano-Ag Bi-2212 powder.

In order for the benefits of Ag to promote generation of a surface liquid on all grains, the Ag nanopowder needs to be homogeneously dispersed within the Bi-2212 powder. Dispersal of a nanopowder is complicated by a tendency toward aggregation via electrostatic charging. Disaggregation has been difficult to achieve in many applications requiring homogeneous dispersal at nanoscale. A method of homogenous dispersal utilizes energetic acoustic mixing, in which the powder mixture is placed in a container that is in contact with a high-power audio-frequency acoustic oscillator. High-powered acoustical energy is delivered to the sample that creates local agitation forces that exceed the cohesive electrostatic forces to homogenously disperse the Ag nanoparticles. In some embodiments, mixing of the nano-Ag powder into the Bi-2212 fine powder is done using a 60 Hz acoustic modulator that produces a 90 g-force cyclic acceleration in the powder mixture for a mixing time of 5 minutes. These parameters produce a homogeneous dispersion of the two powder constituents.

Preparation of the Textured-Powder Samples for Microstructure Analysis

Samples of nano-Ag Bi-2212 powder were placed in a cylindrical die and uniaxially compressed under a stress of 138 MPa to form a cold-sintered pellet. This compression produces a texturing of ~80% in the powder—the polarization of the c-axis (normal to the face of the pellet) in the ensemble of powder particles.

Surface-Melt Heat Treatment

Sample pellets of textured-powder nano-Ag Bi-2212 powder were placed into a furnace and subjected to a surface-melt heat treatment including a succession of temperatures in a pure-oxygen atmosphere (1 bar absolute pressure—but may be lowered to reduce temperature to as low as 50° C. below 2212 melt temperature). The surface-melt heat treatment was applied by increasing temperature either rapidly or gradually to a selected peak temperature, holding at the peak temperature for 20 minutes, then turning off the furnace so that the sample temperature decreased rapidly. As will be appreciated by those having skill in the art, shorter or longer baking times and/or higher and lower temperatures may be used to control grain size and grain growth rate.

A pellet that received a surface-melt heat treatment at 877.5° C. for 20 minutes showed no visible evidence of parasitic phase formation. The pellet showed a near-zero porosity in large areas of the polycrystalline surface, and the pores that did exist are on a significantly small scale compared to those generated from a conventional, partial-melt process. This indicates that the Bi-2212 particles do not melt at 877.5° C., but that surface melting is induced by the dispersal of Ag nanoparticles. The pellet also showed that grains grew in the a-b plane from ~1 µm to ~5 µm in only 20 minutes time. The silver nanoparticles remained dispersed and there is no evidence of parasitic phases, and no evidence for porosity in the polycrystalline layer. Analysis of the pellet also shows that the grains have grown into one another at the grain boundaries. The intergrowth of neighboring grains into one another indicates the development of connectivity enabling superconducting-current transport. The grains grew to the point of contact with their neighbors on all sides. The result of heat treatment at 877.5° C. in pure oxygen thus achieves the surface-melt heat treatment disclosed above.

From the experiments that have been performed thus far, the melting temperature of the Bi-2212 with the silver powder is approximately 878.4° C. Beyond the melting temperature, there is a clear transition and parasitic phases begin to immediately show. Thus the processing temperature of Bi-2212 should be maintained below the melting temperature of approximately 878.4° C. It has been shown that this behavior occurs on a slower scale at temperatures near 873.7° C. FIG. 1 is a graph that showing results from an analysis of phase changes of oxide layers for various samples of nano-Ag Bi-2212. FIG. 1 shows that, for the samples tested, Bi-2212 in contact with silver will not produce any parasitic phases below approximately 860° C. Thus, there needs to be a balance between the bake and soak times. At approximately 860° C., no parasitic growth is observed but the time needed to grow Bi-2212 to large grains is extended. However, with homogenously dispersed Ag, grain-growth occurs 10× faster than Bi-2212 by itself below the melting temperature.

Figure 2A:
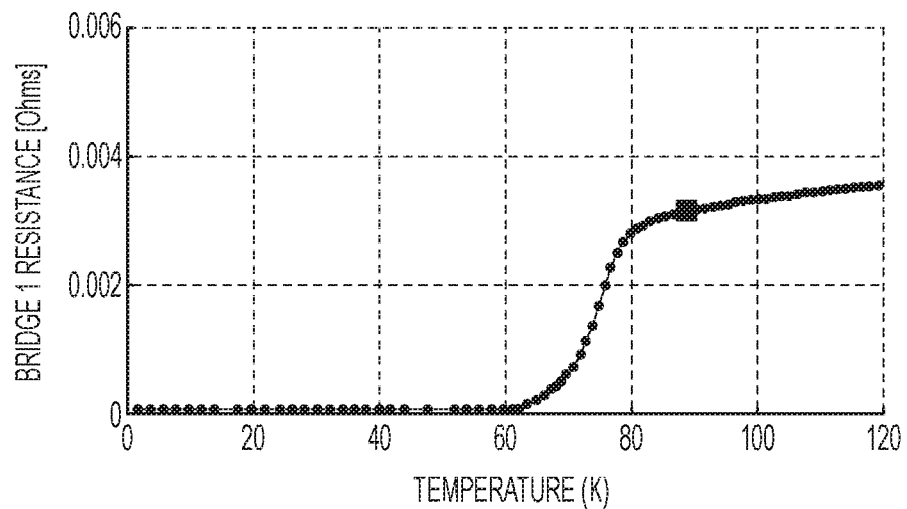
FIG. 2A is a graph showing resistance of a sample vs. temperature for a 878.4° C. heat treatment
Figure 2B:
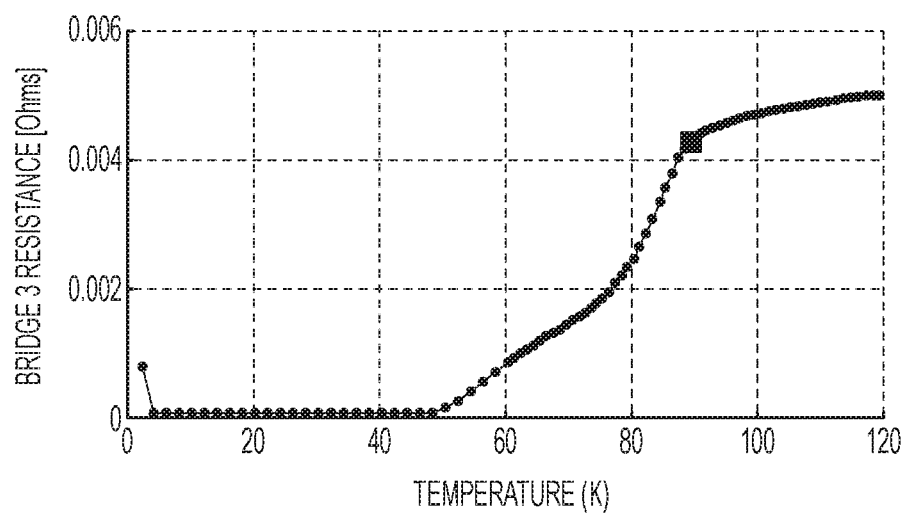
FIG. 2B is a graph showing resistance of a sample vs. temperature for a 877.5° C. heat treatment.

To analyze properties of the sample and to confirm that Bi-2212 resulted from the surface-melt heat treatment, Physical Property Measurement System (PPMS) measurements were made to determine the transition temperature of pellets. FIGS. 2A and 2B show resistance as function of temperature. FIG. 2A shows resistance measurements for pellets treated at 878.4° C. and FIG. 2B shows resistance measurements for pellets treated at 877.5° C. FIGS. 2A and 2B show that a transition temperature of around 76 K was obtained, which indicates that the silver does not impede the Tc of the conductor. As shown in FIG. 2A, the 878.4° C. pellet had a clean transition, but had higher resistance. This is because the pellet started to melt, resulting in creation of parasitic phases.

The morphology of compositions formed by the methods disclosed herein differ from compositions characterized by conventional heat-melting processes. In the compositions formed by the latter method, large grains having a lot of porosity and parasitic phases are formed. In contrast, the methods of the claimed invention form grains that are smaller and are not porous. Additionally, in compositions formed by the inventive methods, the grains are interconnected, unlike grains formed using conventional processes that exhibit a haphazard and directionally random morphology.

The compression of nano-Ag Bi-2212 powder may be accomplished in various ways. For example, the nano-Ag Bi-2212 powder may be formed into long rectangular prisms with a square cross-section, hereafter called a core. The core is inserted into a square-hole metal sheath tube and the ends of the tube are sealed by inserting metal plugs and swaging them to crush metal-on-metal. The sealed assembly of a core inside a sheath tube is hereafter called a sub-element. Sub-elements may be extruded using conventional extrusion technology at room temperature. The extruded subassemblies can then be stacked to form a hexagonal assembly that comprises the extruded subassemblies. The hexagonal assemblies can then be drawn using conventional fine-wire-drawing methods, and re-stacked to form a new assembly referred to as a full assembly. The full assembly can be drawn one more time to the desired final wire size. Analysis of cross-sections of the drawn wire show uniform cross-sections with no indication of sausaging.

In certain embodiments, the metal sheath tube can be made from other metals, such as, for example, nickel rather than silver or silver alloy. When using a nickel metal sheath tube, the nickel is first oxidized in pure oxygen at a temperature higher than the heat-treatment temperature (e.g., around 900° C.) for a time longer than the heat-treatment time (e.g., 24 hours). This pre-oxidation forms an oxide layer on all surfaces of the nickel so that it is passivated from capturing oxygen that is released from the surface melting of the nano-Ag Bi-2212 powder cores, and also so that metallic nickel is shielded from direct contact with the cores so that it is suppressed from the possibility of diffusing into the cores and replacing Cu in the Bi-2212 stoichiometry. In some embodiments, metals other than nickel could be used for this purpose.

Figure 3A:
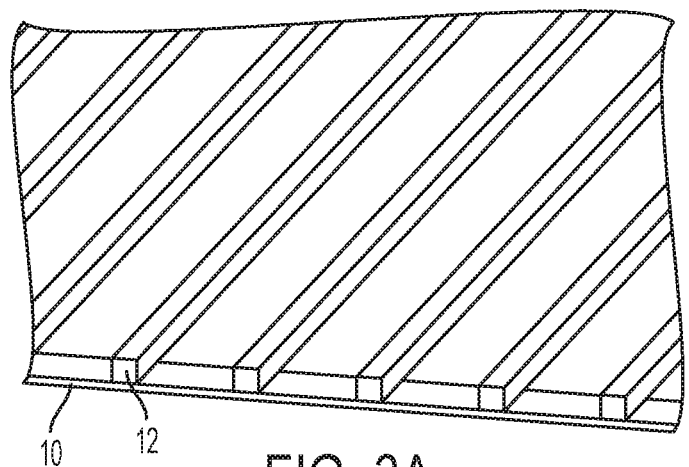
FIGS. 3A, 3B and 3C show a fabrication sequence of a Bi-2212 jelly roll.
Figure 3B:
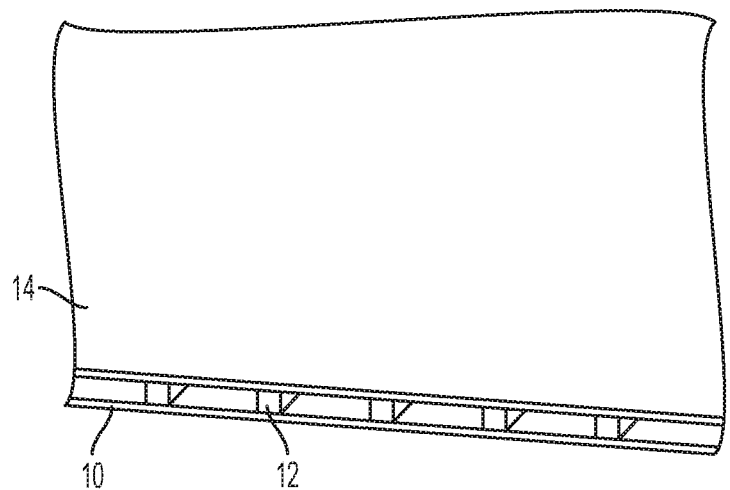
Figure 3C:
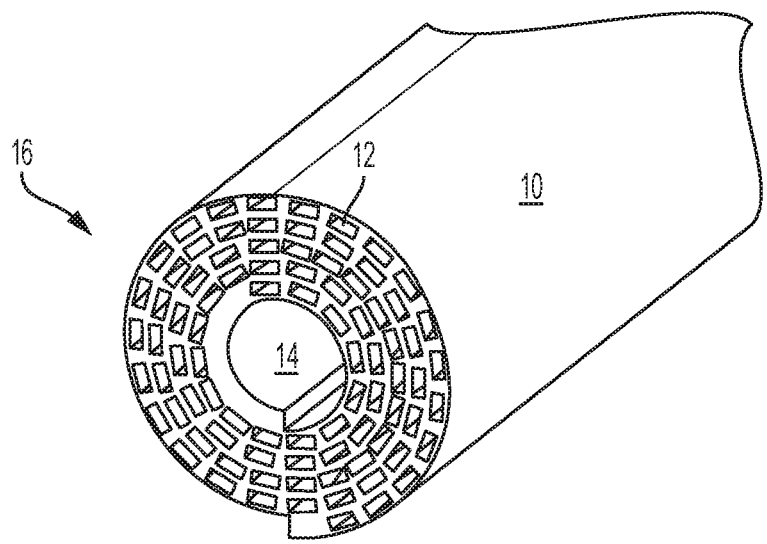

In some embodiments, instead of the restacked rod process described above, a modified jelly-roll process can be used to make a multifilament wire. FIGS. 3A-3C illustrate an exemplary jelly-roll process. The jelly-roll process allows for a textured surface of the jelly-roll to always be perpendicular to the radial direction of a wire that is formed by the jelly-roll process. In other words, the a-b phase is parallel to an azimuth of the jelly roll. The jelly roll can be fabricated using several processes such as welding, stamping, acoustic welding, or any number of methods to fabricate uniform undulations on a flat surface.

A jelly roll 16 comprises a base Ag foil 10, a plurality of Bi-2212 bricks 12, and a top foil 14. In some embodiments, the base Ag foil 10 is a sheet of silver that provides a base or substrate to receive the plurality of Bi-2212 bricks 12. In a typical embodiment, the base Ag foil 10 is a high purity, standard mill product from, for example, the jewelry industry or as a specialty vacuum brazing product. The base Ag foil 10 can serve as a substrate and matrix material for the jellyroll 16. The plurality of Bi-2212 bricks 12 are laid out on the base Ag foil 10 with space between each of the plurality of Bi-2212 bricks 12. Once the plurality of Bi-2212 bricks have been laid upon the base Ag foil 10, the top Ag foil 10 is placed on top of the plurality of Bi-2212 bricks 12 to form a composite structure (e.g., see FIG. 3B). The composite structure is then rolled to form the jelly roll 16. A diameter of the jelly roll 16 is determined by the number of layers formed as the composite structure is rolled. In some embodiments, the composite structure may be rolled around a mandrel or other structure to assist with the rolling process. The rolled composite structure may be jacketed in an outer Ag tube or foil, extruded to remove void space, re-stacked, re-sheathed, and drawn to fine wire dimensions.

Tail-End Treatment

Using a heat treatment similar to F. Kametani (see FIG. 4), the peak time was extended to a 24-hour period and the temperature was reduced so as to not melt the Bi-2212 but to allow the crystal to grow while in contact with the silver. Adding a tail-end profile of 836° C. for 48 hours to the heat treatment healed the Bi-2212 of any parasitic phases, thus allowing for higher temperature bakes. The higher temperature bakes allow for larger grain growth of the Bi-2212.

Figure 4:
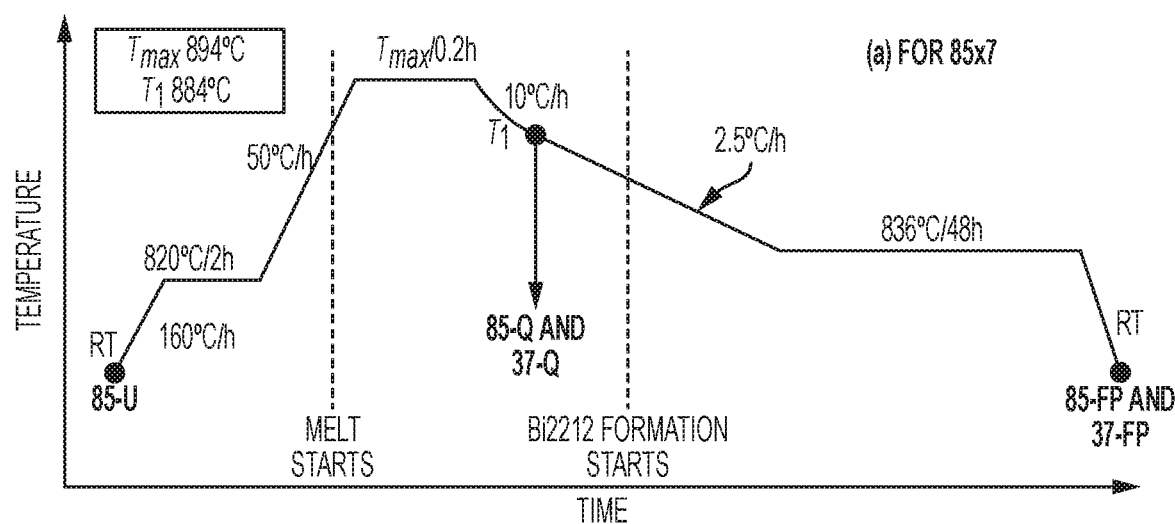
FIG. 4 is a graph illustrating a heat-treatment process for growing crystals of nano-AG Bi-2212.

A comparison was made between a sample heated according to the process shown in FIG. 4 and a Bi-2212 sample heated at 875° C. for 6 hours. The Bi-2212 sample that was heated at 875° C. for 6 hours was found to contain parasitic phases. The size of the parasitic phases were large compared to the grain size of the sample. In contrast, the sample that was heat treated according to the process of FIG. 4 was found to contain no parasitic phases. Thus, it appears that the tail-end treatment of FIG. 4. allows using a higher temperature that obtains larger crystal formation, which is evidenced by the larger crystals that were observed in the sample that was treated with the tail-end treatment.

Bi-2212 Proposed Textured Powder Wire Development Process

Figure 5:
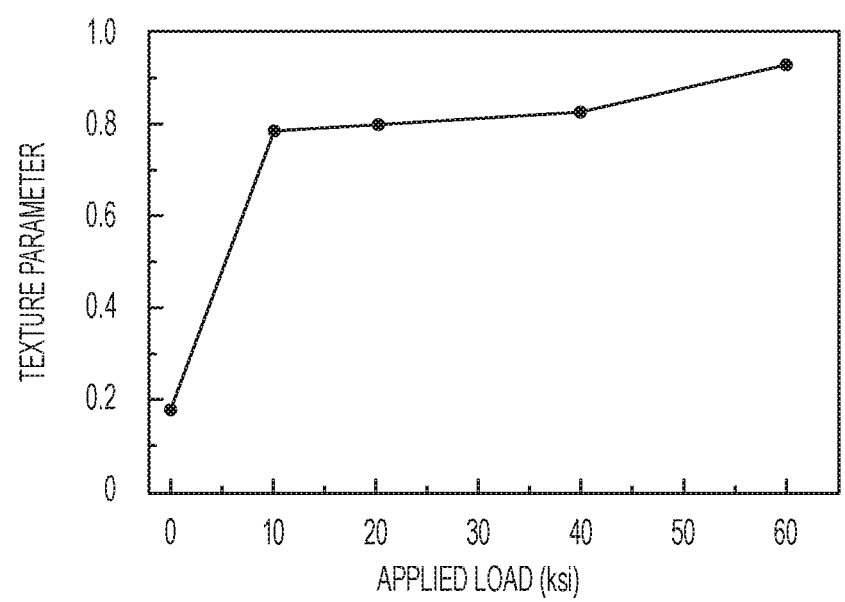
FIG. 5 is a graph showing a texture parameter vs. an applied load for a Bi-2212 sample that has been process with an 875° C. heat treatment.

Approximately phase pure Bi-2212 powder of ~1 μm in size was acoustically mixed with silver powder of the size scale of tens of nm to produce a homogenous mixture. The nano-Ag Bi-2212 mixture was then loaded into a female side of a die. The die was uniaxially pressed at approximately 20 KSI to form an enhanced textured-powder (ETP) core. FIG. 5 shows that a uniaxial load of approximately 10-20 KSI results in a texture parameter of around 0.8. FIG. 5 also shows that increasing the uniaxial load significantly past 20 KSI does not yield a significant increase in the texture parameter. By uniaxially pressing the Bi-2212 powder, the powder texturizes and aligns ab planes of a grain with its neighboring grains.

Next, the ETP cores are cut and filed to fit into a silver tube that makes up the silver matrix of the wire. This is done inside of a glove box to minimize the ETP cores exposure to air and moisture. Multiple cores can be loaded into a single silver tube to make a billet as long as needed. The billet is then drawn down to a mono-core wire, stacked, and redrawn. This process can be repeated until the desired number of filaments and wire size are achieved. For exemplary purposes, lengths of monocore of 6-on-1 and 7×19 stacks were made. The drawing process had no problems; each wire drew smoothly with no sausaging or breaks in the wire. The texture of the ETP cores allows the layers, which are micaceous, of the ETP cores to easily glide over each other. Analysis of the ETP cores has not shown any evidence of a boundary between separate ETP cores that were inserted into the tube. The lack of boundaries points to the edges being blended smoothly during the drawing process.

A non-melt heat treatment was used that avoids a transition to liquid state of the cores. However, the addition of silver lowers the melt temperature of Bi-2212 so that some liquid layers may form at the interface of the core and the silver matrix. This liquid is pushed out of the ends of the wires due to the high pressures inside the wire that are reached during heat treatment. To prevent the liquid from being pushed out of the ends of the wires, the ends of the wires are sealed such that the liquid is contained within the wire. For example, melting pure silver and dipping ends of each wire into the liquid silver may be done to prevent the liquid from flowing out of the wire. However, the temperature of the molten silver that is applied to the wire ends is important. If the temperature of the molten silver is too low, the silver will not adhere to the wire with a liquid tight seal. If, on the other hand, the temperature of the molten silver is too high, the molten silver will melt the ETP cores and the cores will run out creating voids.

Figure 6:
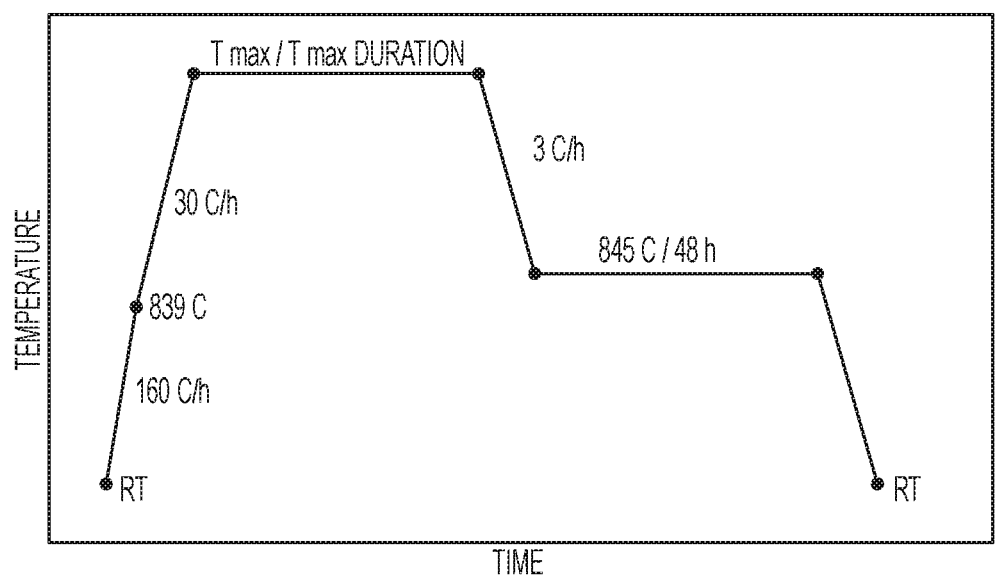
FIG. 6 is a graph illustrating a heat-treatment process for a nano-Ag Bi-2212-sealed wire.

The wires that have been sealed can then be heat treated according to a specific profile, such as, for example, the profile shown in FIG. 6. A value for $T_{max}$ between about 875° C. and about 878° C. was chosen based off of heat treatments of small nano-Ag Bi-2212 pellets to maximize grain growth and interconnectivity while simultaneously never fully melting the ETP core. An anneal phase of the heat treatment is included to heal any parasitic phases that form during the soak at maximum temperature. As shown in FIG. 6, the anneal phase can include lowering the temperature to approximately 845° C. for approximately 48 hours.

Figure 7:
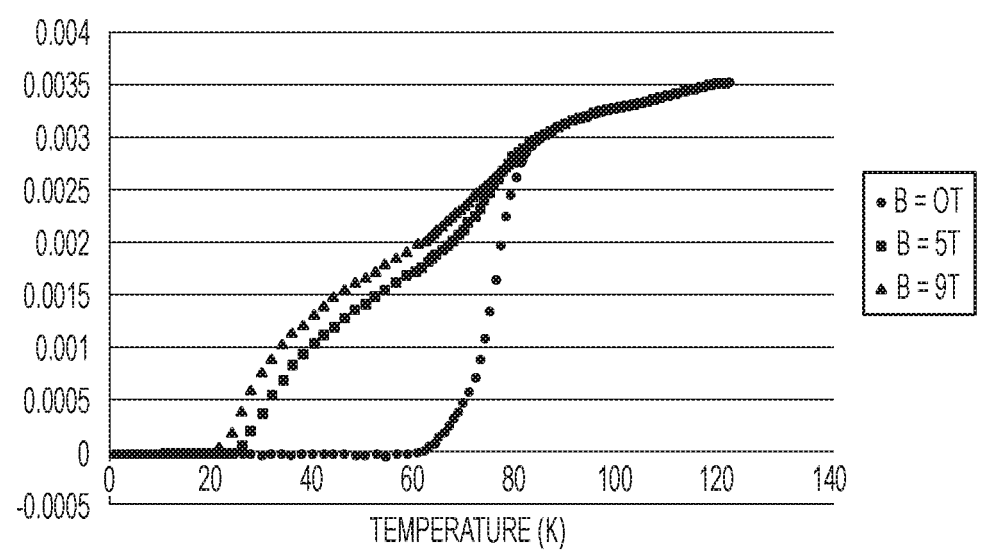
FIG. 7 is a graph showing resistivity of a sample vs. temperature at various T-background fields.

A four point resistivity test was done on a Bi-2212 pellet. The test showed supercurrent transport is achieved over a scale of ~1 cm. However, the test also showed that a critical temperature of the nano-Ag Bi-2212 mixture is higher than that of pure Bi-2212. This means that, while pure Bi-2212 will superconduct at liquid nitrogen temperatures, the addition of the silver powder may have lowered the critical temperature to be below that of liquid nitrogen. FIG. 7 shows resistivity data for a nano-Ag Bi-2212 sample. The resistivity data in FIG. 7 shows that a transition from a superconductor state to a normal state occurs at approximately 70 K for a 0 T background field.

As will be understood by those having skill in the art, in addition to Bi-2212, all of the methods disclosed and claimed herein can be used with powders of Bi-2223 and REBCO.

WORKING EXAMPLES

Potential applications of the Ag-nanopowder-enhanced Bi-2212 wire technology include the following:

Cable-in-Conduit NbTi Dipole for MEIC

In the field of high-energy physics, the properties of nuclear and subnuclear particles are investigated in colliding beam machines in which particle beams are circulated in a vacuum tube within a circular ring of superconducting magnets that guide them in closed orbits. The beams collide at select locations, and there one can study the particles and fields of nature at scales that are equivalent to those in the early universe.

The nano-Ag Bi-2212 wire has properties that are essential to the next generation of particle colliders. The nano-Ag Bi-2212 disclosed herein could be used in conjunction with a 100 TeV hadron collider consisting of a 100 km double-ring of >16 Tesla dipole magnets. A design has been developed for a cable-in-conduit (CIC) that utilizes the nano-Ag Bi2212 wire in its windings to produce that field strength in a suitable dipole. Conventional superconductors, such as, for example, NbTi and Nb3Sn, cannot carry the required current in such high magnetic fields. Furthermore, present-generation OPIT-process Bi-2212 wire has cannot support a large enough current and is too fragile to be used in the windings.

Superconducting Transmission Line for Wind Turbine Farms

Wind turbine farms are the fastest-growing sector of the energy economy. Optimum locations on land tend to be far from power distribution grids, and offshore locations pose the challenge of transmitting the power onshore. Analytical Research Labs has developed a conceptual design for a super-conducting transmission line that can transport 1000 MW of electric power with no electrical resistance. The line uses CIC cables containing the nano-Ag Bi-2212 wire, operating with liquid hydrogen cooling.

Open-MRI Imaging for Breast Cancer Screening and Thoracic Imaging During Surgery The nano-Ag Bi-2212 wire may be used with a design for an open-MRI system that can produce a compact region of homogeneous field with the field strength (e.g., 1.5 T) needed for contrast-enhanced breast imaging and for high-resolution thoracic imaging. The nano-Ag Bi2212 wire is used to produce flux jets that can make a region of homogeneous magnetic field in a region just above a top surface of a magnet.

Superferric CIC Gantry for Proton- and Ion-Beam Cancer Therapy

The nano-Ag Bi-2212 wire may be used with a 3 T superferric gantry for proton- and ion-beam therapy has been developed. The 3 T superferric gantry utilizes a combined-function dipole in which the windings would utilize the nano-Ag Bi-2212 wire and operate at a temperature of approximately 30 K, cooled by liquid hydrogen.

While this invention has been particularly shown and described with references to example embodiments thereof, it will be understood by those skilled in the art that various changes in form and details may be made therein without departing from the scope of the invention encompassed by the appended claims.

What is claimed is:

1. A method for fabricating a superconducting wire, the method comprising the steps of:
    compressing a mixture of a superconductor powder with a silver nanopowder to produce a textured-powder core by compressing the mixture;
    inserting the textured-powder core into a cylinder;
    sealing the cylinder by inserting plugs into ends of the cylinder; and
    processing the cylinder to form a wire.

2. The method of claim 1, wherein the compressing further comprises:
    placing the mixture into a female-forming die;
    pressing a male-forming die into the female-forming die; and
    wherein the male-forming die has side boundaries that form a close-sliding fit within the female-forming die.

3. The method of claim 1, wherein the cylinder is a metal cylinder and the plugs are metal plugs that are welded to the metal cylinder.

4. The method of claim 1, wherein the processing comprises an extruding process.

5. The method of claim 1, wherein the processing comprises a drawing process.

6. The method of claim 1, further comprising:
    heat treating the cylinder at an elevated temperature in an oxygen-rich atmosphere to form a passivated oxide layer on a surface of the cylinder prior to the inserting; and
    removing the passivated oxide layer from the surface of the cylinder after insertion of the textured-powder core.

7. The method of claim 1, wherein:
    the cylinder for processing comprises multiple cylinders arranged in parallel, each of the multiple cylinders being formed from the compressing, the inserting, and the sealing steps; and
    the wire is a bonded composite wire comprising the multiple cylinders.

8. The method of claim 7, further comprising:
    heating the bonded composite wire to a temperature equal to a melt temperature of the superconducting powder;
    holding the temperature at the melt temperature for a dwell time; and
    ramping the temperature downward to an intermediate temperature for a second dwell time to provide for annealing of the bonded composite wire.

9. The method of claim 8 wherein the melt temperature is approximately 878.4° C.

10. The method of claim 8 further comprising:
    heating the bonded composite wires to a temperature just below the melt temperature of the superconducting powder;
    holding the temperature at just below the melt temperature for a first dwell time to provide for surface melting on crystal surfaces of the superconducting powder and solid-phase diffusion of atomic species within the superconducting powder; and
    ramping the temperature down with provision of a second dwell time at an intermediate temperature to provide for annealing of the superconducting powder within cavities of the bonded composite wire.

11. The method of claim 10 wherein the temperature for the first dwell time ranges from 860-877.5° C.

12. A method for achieving homogeneous dispersal of silver nanopowder in a composition, the method comprising: mixing silver nanopowder with a superconductor powder via a high energy acoustic mixing by placing the silver nanopowder and the superconductor powder in a container that is in contact with a high-power audio-frequency acoustic oscillator.

13. The method of claim 12, wherein the mixing is comprises using a 60 Hz acoustic modulator to produce 90 g of cyclic acceleration.

* * * * *